United States Patent
Byrne et al.

(10) Patent No.: US 6,310,776 B1
(45) Date of Patent: Oct. 30, 2001

(54) TRANSVERSE MOUNTABLE HEAT SINK FOR USE IN AN ELECTRONIC DEVICE

(76) Inventors: Vincent Byrne, 2304 Homestead Dr., Mesquite, TX (US) 75181; Edward C. Fontana, 319 Columbia Dr., Rockwall, TX (US) 75087; Ralph Sandage, 2409 Homestead Dr., Mesquite, TX (US) 75181; Joanne Zhang, 8812 Christian Ct., Plano, TX (US) 75025

( * ) Notice: Subject to any disclaimer, the term of this patent is extended or adjusted under 35 U.S.C. 154(b) by 0 days.

(21) Appl. No.: 09/624,102

(22) Filed: Jul. 24, 2000

Related U.S. Application Data

(63) Continuation-in-part of application No. 09/259,772, filed on Mar. 1, 1999, now Pat. No. 6,201,699.

(51) Int. Cl.[7] .................................................. H05K 7/20
(52) U.S. Cl. ........................... 361/707; 24/457; 174/16.3; 257/727; 361/703; 361/719
(58) Field of Search .................... 257/706, 707, 257/712, 713, 722, 718, 719, 726, 727; 165/80.3, 185; 174/16.3; 361/703, 704, 707–711, 717–719; 267/150, 158, 160; 24/473, 625, 457, 458; 248/505, 510

(56) References Cited

U.S. PATENT DOCUMENTS

| | | | |
|---|---|---|---|
| 3,219,885 | * | 11/1965 | Schniers . |
| 3,220,471 | * | 11/1965 | Coe . |
| 3,519,889 | * | 7/1970 | Monaco . |
| 3,566,959 | * | 3/1971 | Koltuniak et al. ................... 165/80.3 |
| 4,027,206 | * | 5/1977 | Lee ........................................ 361/697 |
| 4,235,285 | * | 11/1980 | Johnson et al. ...................... 165/80.3 |
| 4,588,023 | * | 5/1986 | Munekawa ....................... 165/104.33 |
| 4,602,315 | * | 7/1986 | Breese ................................... 361/709 |
| 4,899,255 | * | 2/1990 | Case et al. ............................ 361/720 |
| 5,109,318 | * | 4/1992 | Funari et al. ......................... 361/710 |
| 5,170,325 | * | 12/1992 | Bentz et al. .......................... 361/707 |
| 5,343,361 | * | 8/1994 | Rudy, Jr. et al. ..................... 361/710 |
| 5,343,362 | * | 8/1994 | Solberg ................................. 361/710 |
| 5,461,542 | * | 10/1995 | Kosak et al. .......................... 361/710 |
| 5,507,092 | * | 4/1996 | Akachi ............................... 29/890.03 |
| 5,719,745 | * | 2/1998 | Agonafer et al. ..................... 361/704 |
| 5,808,869 | * | 9/1998 | Donahoe et al. ..................... 361/704 |
| 5,854,738 | * | 12/1998 | Bowler ................................. 361/695 |
| 5,870,286 | * | 2/1999 | Butterbaugh et al. ............... 361/704 |
| 5,927,386 | * | 7/1999 | Lin ....................................... 165/80.3 |
| 5,973,921 | * | 10/1999 | Lin . | 
| 5,995,369 | * | 11/1999 | Kiermeier et al. ................... 361/704 |
| 6,049,459 | * | 4/2000 | Edmonds et al. .................... 361/707 |

* cited by examiner

*Primary Examiner*—Gerald Tolin

(57) ABSTRACT

The present invention provides a heat sink that, in an advantageous embodiment, includes a spine having a width with first and second opposing sides that are oriented to be abnormal to the substrate when the heat sink is mounted on the substrate. The heat sink further includes an electronic device support leg that extends generally transverse from the first side and that is configured to support a heat generating electrical component thereon. Alternative embodiments of the present invention may include a plurality of such electronic device support legs. A plurality of cooling fins are also included in the present invention, extending from the second side. Moreover, each of the plurality of cooling fins has a depth that is substantially less than the width of the heat sink, which give this unique heat sink an exceptional cooling efficiency. In particular advantageous embodiments, the depth to width ratio of the fins and spine, may range from about 1 to 5 or 1 to 10, respectively.

9 Claims, 10 Drawing Sheets

TRANSVERSE MOUNTABLE HEAT SINK FOR USE IN AN ELECTRONIC DEVICE

CROSS-REFERENCE TO RELATED APPLICATION

This application is a continuation in part of U.S. patent application Ser. No. 09/259,772, allowed filed on Mar. 1, 1999, entitled "TRANSVERSE MOUNTABLE HEAT SINK FOR USE IN AN ELECTRONIC DEVICE" to John W. Ayres, et al., now U.S. Pat. No. 6,201,699 which is incorporated herein by reference

TECHNICAL FIELD OF THE INVENTION

The present invention is directed, in general, to a heat sink and, more specifically, to a transverse mountable heat sink for use in an electronic device.

BACKGROUND OF THE INVENTION

Certain electronic and electrical components and devices mounted on printed circuit and wiring boards generate considerable operating heat that, unless controlled, may result in temperature related circuit or component failure. The generally preferred control method is to use a heat sink to transfer component heat to the air.

A heat sink can be made of any material with favorable heat transfer characteristics, such as copper, aluminum or steel. Aluminum is generally preferred because it is inexpensive, easy to work with, lightweight, and has good heat transfer characteristics. The heat sink and heat generating component are usually placed in direct contact with one another to more efficiently cool the component.

In most cases, after the heat sink absorbs component heat, the heat is transferred to the surrounding air by conduction or convection. In order to facilitate heat transfer, heat sinks frequently have "fins" to increase the total surface area that serves to conduct or convect heat.

A typical printed wiring or circuit board may have a number of heat generating devices. That is why it is not unusual to have a number of heat sinks on a single circuit board associated with heat generating devices and components. Because circuits are frequently enclosed in cabinets or other enclosures, a fan is used to move air across the heat sink and facilitate the transfer of heat to the air.

When a number of heat sinks are required, design factors in addition to temperature control must be taken into consideration. When a printed circuit or wiring board requires a number of heat sinks, the area of the board occupied by heat sinks will often constitute a significant fraction of the total board space. Similarly, a significant fraction of the total volume available to house a circuit will be taken up by heat sinks when a number of heat sinks are required. Because the total area required for heat sinks may be significant, the board size is often dictated by heat sink requirements. Another factor designers must consider is total heat sink weight when a number of heat sinks are required. Designers, therefore, must address heat dissipation problems from a space and weight viewpoint in designing electronic equipment in order to produce the highly valued small electronics system that some customers prefer.

Designing heat sinks and arranging them to provide for more efficient thermal performance in a smaller space has, in some instances, created its own set of problems. One such problem is that the amount of working space on the printed circuit or wiring board has been reduced, making it more difficult to assemble the circuit. Another problem is that the mounting surfaces on the heat sink to which the heat generating components are fastened are not as accessible as they were on prior art heat sinks. Prior art threaded fastener secured clamps can sometimes be very difficult to use in fastening electronic components to the heat sinks. In some cases, the most advantageous heat sink geometry does not provide paths for tools to reach screws and other fasteners, thereby preventing this advantageous heat sink geometry from being used with prior art clamps. These prior art devices often require significant time and effort to attach an electrical component, which, of course, adds manufacturing cost and hampers production efficiency. Prior art spring clip designs do not address the problem of mounting components on the opposing sides of a heat sink leg nor do they address the problem of the spring clip detaching from the heat sink or electronic component to which they are supposed to be attached. In such situations where the spring clip detaches from the heat sink or electrical component that they are supposed to be connected, the likelihood of a short increases tremendously.

Accordingly, what is needed in the art is a heat sink design that can efficiently cool a number of heat generating devices or components while utilizing a minimum amount of space on a printed wiring or circuit board and a minimum volume within the enclosure. Also needed in the art, is a component retention clip for such a heat sink assembly, that does not experience the problems associated with the prior art retention clips.

SUMMARY OF THE INVENTION

To address the above-discussed deficiencies of the prior art, the present invention provides a device retention clip. The device retention clip includes a resilient strip having an arcuate portion and first and second opposing surfaces extending from the arcuate portion, wherein the resilient strip is configured to encompass an electronic device and an electronic device support adjacent the electronic device. The device retention clip further includes a retaining arm extending from the resilient strip and configured to extend at least partially around the electronic device support, such as a fin or leg of a heat sink, or the electronic device thereby to partially retain the electronic device against the electronic device support.

Another aspect of the invention provides an electronic assembly. The electronic assembly, in addition to including the device retention clip discussed above, includes a printed wiring board having a heat sink coupled thereto, wherein the heat sink has a plurality of cooling fins and an electronic device support. The electronics assembly further includes an electronic device couplable to the electronic device support, using the previously mentioned device retention clip.

The foregoing has outlined, rather broadly, preferred and alternative features of the present invention so that those who are skilled in the art may better understand the detailed description of the invention that follows. Additional features of the invention are hereinafter described that form the subject of the claims of the invention. Those who are skilled in the art should appreciate that they can readily use the disclosed conception and specific embodiment as a basis for designing or modifying other structures for carrying out the same purposes of the present invention. Those who are skilled in the art should also realize that such equivalent constructions do not depart from the spirit and scope of the invention in its broadest form.

BRIEF DESCRIPTION OF THE DRAWINGS

For a more complete understanding of the present invention, reference is now made to the following descriptions taken in conjunction with the accompanying drawings, in which.

DETAILED DESCRIPTION

Figure 1A:
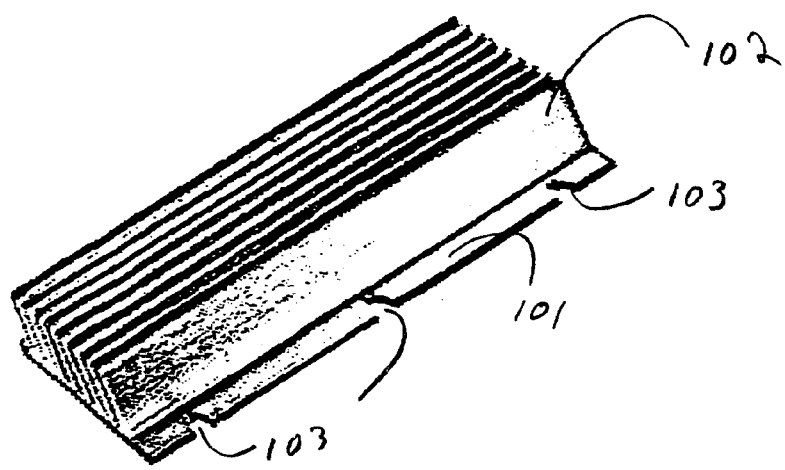
FIGS. 1A–1B illustrate embodiments of prior art heat sinks.
Figure 1B:
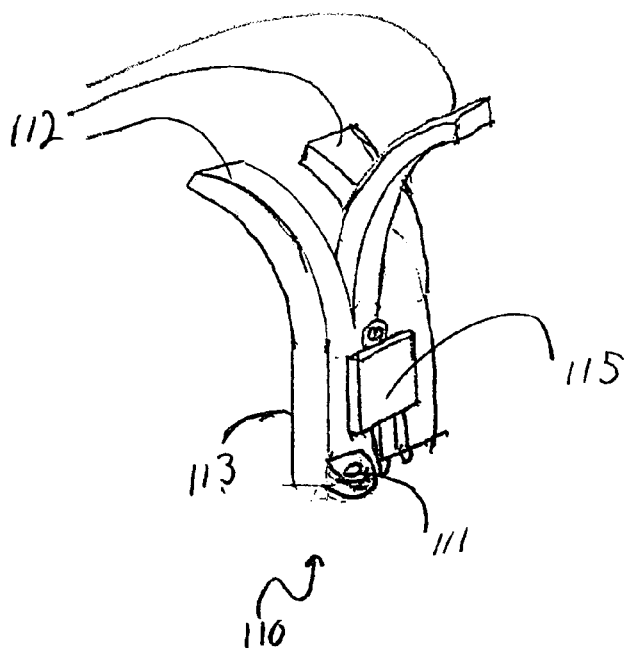

Referring initially to FIGS. 1A and 1B, illustrated are examples of prior art heat sinks 100, 110. The prior art heat sink 100 illustrated in FIG. 1A is for mounting directly to a rectangular electronic device or component that generates heat, such as a power supply. The bottom plate 101 of the heat sink 100 has a series of cooling fins 102 extending from it and a series of slots 103 along the edge that can be used to fasten the heat sink 100 directly to a heat generating device or component. As thus mounted, the direct contact of the bottom plate 101 with the device permits the device to transfer heat directly to the heat sink 100. The heat absorbed by the heat sink 100 is dispersed throughout the structure of the heat sink 100, including its cooling fins 102. The cooling fins 102 then transfer the heat into the surrounding air by conduction or convection. When a fan facilitates the movement of air across the heat sink 100, the direction of air flow parallels the surface of the cooling fins 102.

FIG. 1B illustrates another prior art heat sink 110. This heat sink 110 is designed so that a heat generating component 115 is mounted directly to the heat sink 110. The component 115 is typically mounted to the heat sink 110 by conventional screws or bolts or a combination of clamping plates and bolts or screws. The heat sink 110 can also be fastened to a circuit or wiring board by the same type of fasteners as described above. In this case, screw holes 111 are provided to mount the heat sink 110 on the board. This heat sink 110 also has multiple cooling fins 112 that extend from the floor plate 113. FIG. 1B illustrates that, as a general rule, the board space required to accommodate a heat sink 110 together with its associated component 115 is larger than the space that would be required if only the component itself had to be accommodated. In short, the proportionate size or footprint of the heat sink 110 is significantly larger than the size or footprint of its associated component 115. This is a distinct disadvantage if space is a limiting factor.

It is not unusual for several heat sinks to be required on a circuit or wiring board in order to control the heat generated by multiple devices and components. Because heat sinks generally have a significantly larger footprint than their associated components, a heat sink design that can provide heat control for several devices that would otherwise require multiple heat sinks is highly desirable, particularly for the more compact electronic devices many customers prefer.

If the number of heat sinks on a circuit or wiring board can be reduced, fewer parts will be required to assemble the electronic device. If fewer parts are required, the total manufacturing cost, both with respect to total part cost as well as assembly cost, will be less. The present invention addresses the space, weight and cost problems discussed above that are inherent when multiple heat sinks are used, without impairing the ultimate objective of heat control.

Figure 2A:
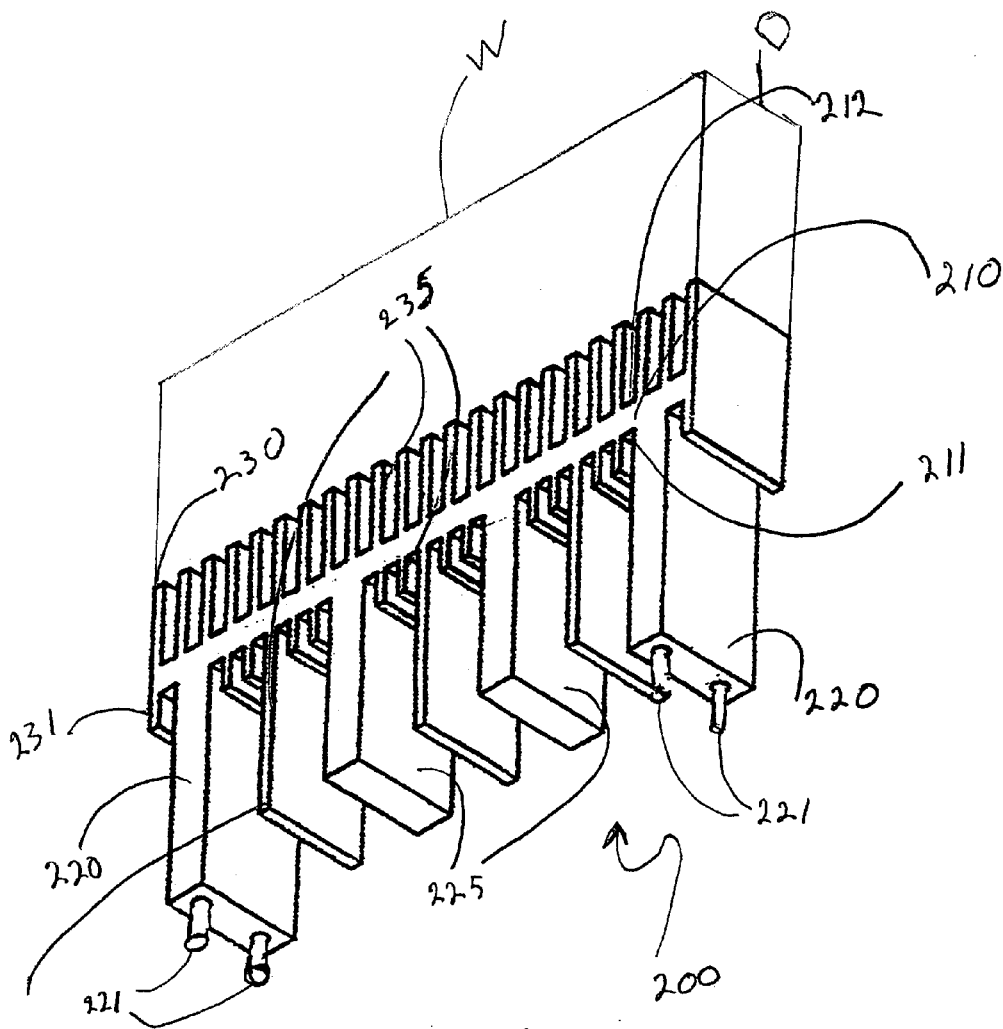
FIGS. 2A–2D illustrate an embodiment of a heat sink constructed in accordance with the present invention.

FIG. 2A illustrates an embodiment of the present invention. The heat sink 200 has a longitudinal spine 210 with an opposing first side 211 and second side 212. When mounted to the surface of a circuit or wiring board (not shown), the opposing first side 211 and second side 212 of the spine 210 are parallel, or at an angle other than a normal angle, to the surface of the board (i.e., abnormal). In the embodiment illustrated, the spine 210 is designed to be parallel with the surface of the board when the heat sink 200 is mounted on the board.

Figure 2B:
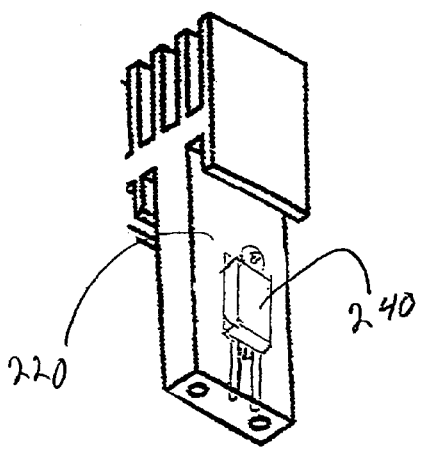
Figure 2C:
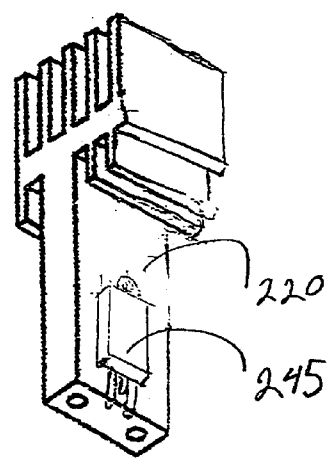

Extending from the first side 211 of the spine 210 are electronic device support legs 220, 225, configured so that each leg 220, 225 can support two electronic devices or components on opposing side of the support legs 220, 225. FIG. 2B illustrates one side of a support leg 220 with an electronic component 240 mounted on it by screws, clips, or other generally recognized mounting method. FIG. 2C illustrates the reverse side of the support leg 220 with another electronic component 245 mounted on it. The heat sink 200 illustrated in FIG. 2A has four electronic device support legs 220, 225 and can mount eight electronic components 240, 245. In one embodiment of the present invention the support legs 220, 225 have a thermal pad (not shown) covering at least a portion thereof.

Referring again to FIG. 2A, two of the support legs 220 can be used to attach or mount the heat sink 200 to a circuit or wiring board and thus can serve as support legs for the heat sink 200. At the end of each of the two legs 220 that attach to the circuit or wiring board are pins 221 that engage corresponding ports on the board (not shown). In another embodiment, the pins 221 will have snaps or a claw type of fastener to secure the heat sink 200 to the board. This method of mounting is superior to prior art methods because it provides more mechanical stability and eliminates the need for additional fasteners. This aspect of the present invention is discussed in more detail below with respect of FIG. 4B.

Figure 2D:
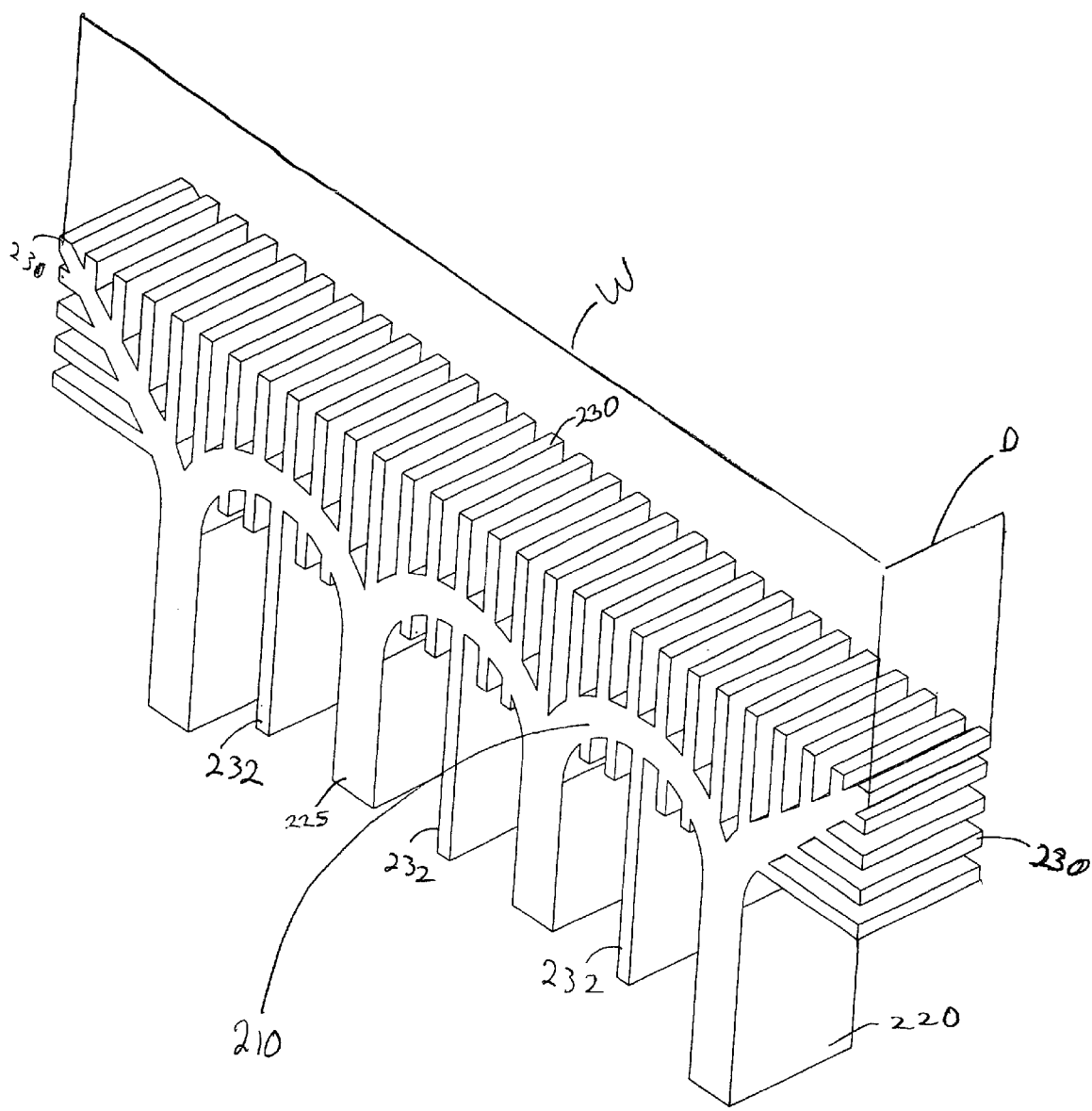

Extending from the second side 212 of the spine 210 are several cooling fins 230. Although this embodiment has a symmetrical array of cooling fins 230, those skilled in the art will recognize that cooling fins 230 may be of a varying length and may extend from the second side at varying angles and still be within the scope of the claimed invention such as the embodiment illustrated in FIG. 2D.

The heat sink 200 has supplemental cooling fins 231, 232 extending from the first side 211. As shown in FIG. 2A, some of the supplemental cooling fins 232 extending from the first side 211 are substantially longer than the other fins 231 in order to provide improved cooling performance at low air velocities. The actual number and length of cooling fins 230, 231, 232 used on a heat sink 200 can vary and still be within the intended scope of the invention.

When the illustrated heat sink 200 is mounted on a circuit or wiring board, it is positioned so the cooling fan circulates air in a direction substantially perpendicular to the width of the spine 210 and substantially parallel to the surface of the cooling fins 230, 231 232. Each cooling fin 230, 231, 232 has a leading edge 235 over which air flow generated by the cooling fan first passes. As the airflow travels past the leading edge 235, a boundary layer forms along the cooling fin 230, 231, 232 surface. The thickness of the boundary layer at the leading edge 235 approaches zero and increases the further the airflow progresses away from the leading edge 235 along the fin 230, 231, 232 surface across the depth of the heat sink 200. The air temperature at the leading edge 235 is the ambient temperature of the air and increases as the distance increases along the surface of the cooling fin 230, 231, 232 away from the leading edge 235. As airflow travels across the depth of the heat sink 200, heat is transferred by conduction and convection into the air with the rate of heat transfer increasing with the difference in temperature between the heat sink 200 and the air.

It has been found, in the present invention, that to maximize heat transfer per unit volume of air flowing across the fins 230, 231, 232, it is advantageous to maximize the leading edge by making the width (W) of the heat sink 200 substantially longer than the overall depth (D) of the fins 230, 231, 232. In a particular advantageous embodiment, the plurality of cooling fins 230, 231, 232 have a depth (D) substantially less than the width (W) of the heat sink 200, which gives this unique heat sink an exceptional cooling efficiency. In advantageous embodiments, the depth to width ratio of the fins 230, 231, 232 and spine, respectively, may range from about 1 to 5 or 1 to 10. However, in a particularly useful embodiment, the ratio is 1 to 5; that is, the depth (D) of each fin 230, 231, 232 is ⅕ of the width (W) of the spine 210 of the heat sink 230.

Because the transfer of heat from the heat sink 200 to the air is more efficient at the leading edges 235 of the fins 230, 231, 232, there is more total leading edge 235 available, which provides a more efficient heat sink 200. Therefore, the illustrated heat sink 200 is particularly efficient because of the abundance of leading edges 235 and because of the efficient depth to width ratio as previously discussed. This unique heat sink therefore provides a maximum amount of heat transfer from several electrical components attached to the heat sink while using a fraction of the space and weight that would be required if prior art heat sinks were used. The depth of the heat sink 200 is dictated by the size of the components 240, 245 associated with it. In particularly efficient embodiments, the heat sink's 200 depth is preferably only slightly larger than the depth of the largest component 240, 245.

Figure 3:
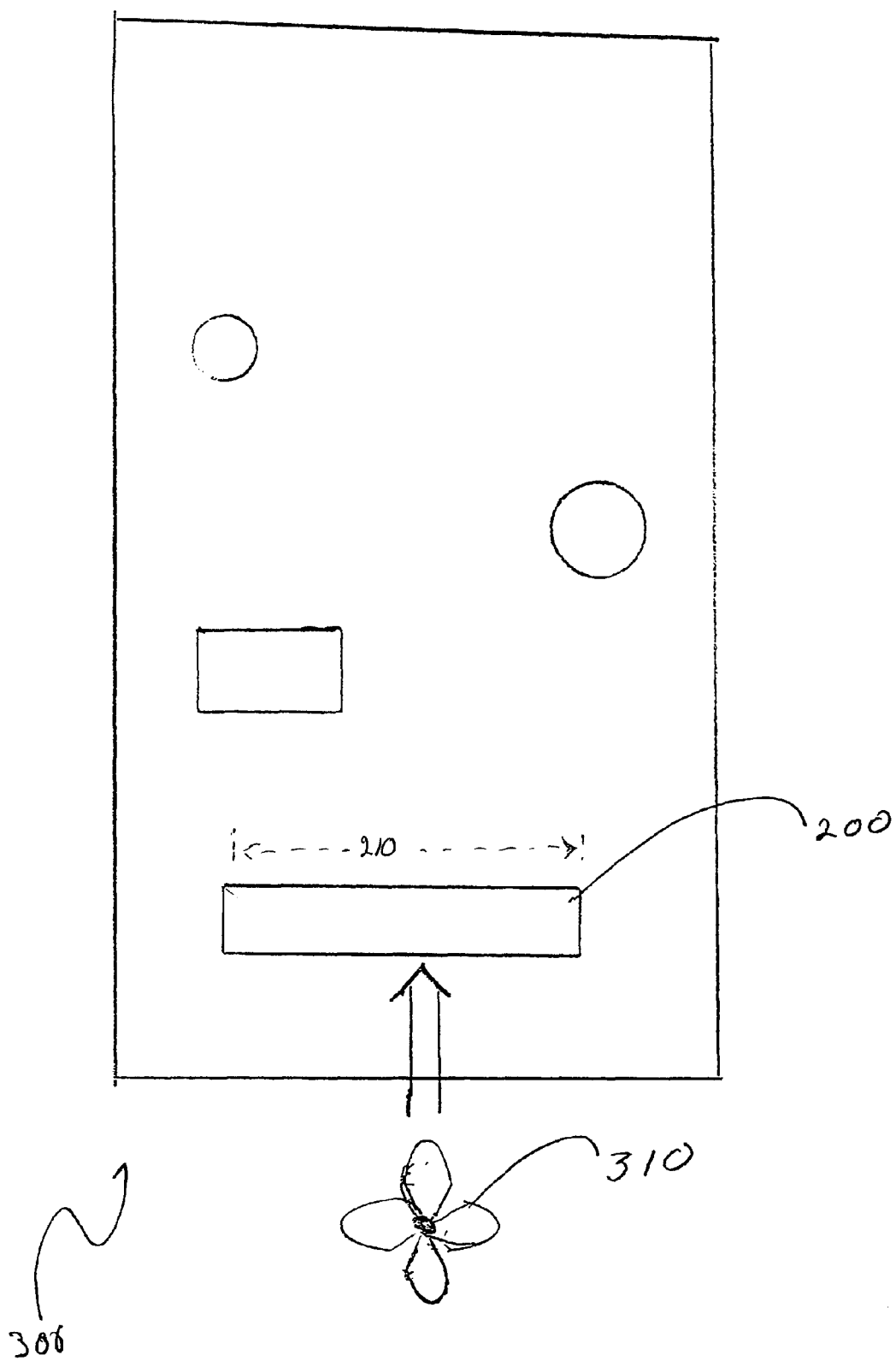
FIG. 3 illustrates a representation of a printed wiring or circuit board with a heat sink mounted thereon.

Turning now to FIG. 3, illustrated is a circuit board 300 with a heat sink 200 installed thereon in a preferable configuration. In a preferred embodiment, the circuit board 300 includes a fan 310 that moves air across the circuit board 300. The heat sink 200 is installed in such a way as to orient its width (W) in a direction perpendicular to the air flow, which is indicated by the arrow.

Figure 4A:
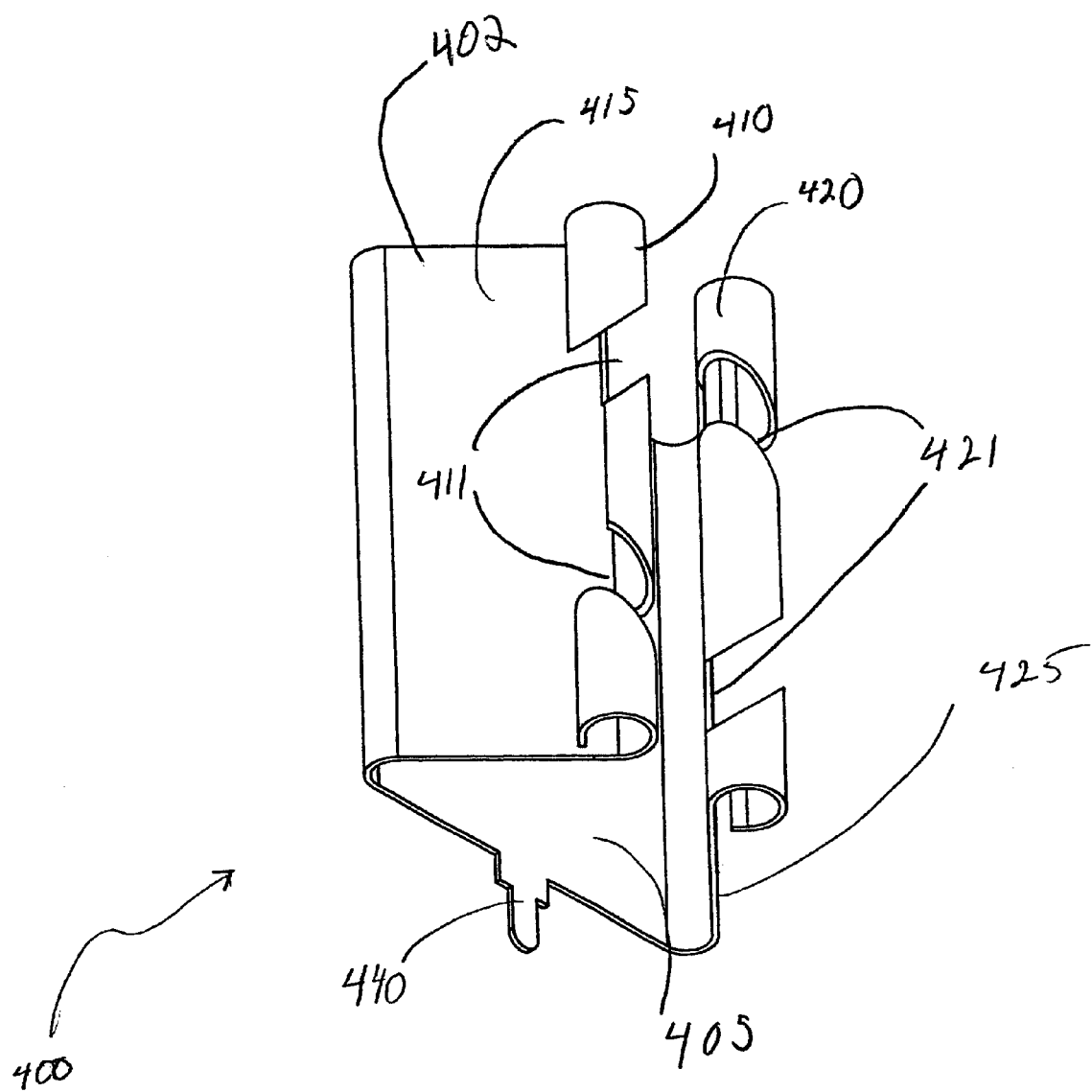
FIGS. 4A–4E illustrate spring clips used to fasten components to the legs of the heat sink.

Turning now to FIG. 4A, illustrated is an embodiment of a clip 400 that, preferably, is used for fastening electronic devices to the electronic device support legs 220, 225. Those skilled in the art will recognize that electronic devices can also be fastened to the electronic device support legs 220, 225 by other methods.

The clip 400 may be a resilient strip 402 that is bent so that it has a first clamping surface 410 at the end of a first opposing surface member 415 and a second clamping surface 420 at the end of a second opposing surface member 425, with the two clamping surfaces 410, 420 in opposition to one another. The resilient strip 402 has sufficient spring-like elasticity so that the two opposing surface members 415, 425 are predisposed to return to their original shape when displaced. To clamp an electronic device on the heat sink's 200 electronic device support leg 220, 225, the opposing first and second surface members 415, 425 are spread apart by using a spreading device inserted in the spreading slots 411, 421 located at the outer edges of the clamping surfaces 410, 420. This provides an efficient, quick and easy way to attach electrical components to the heat sink 200 without having to use screws or other types of fasteners. After the clip 400 is positioned over the components on one of the support legs 220, 225, the spreading device is removed.

Figure 4B:
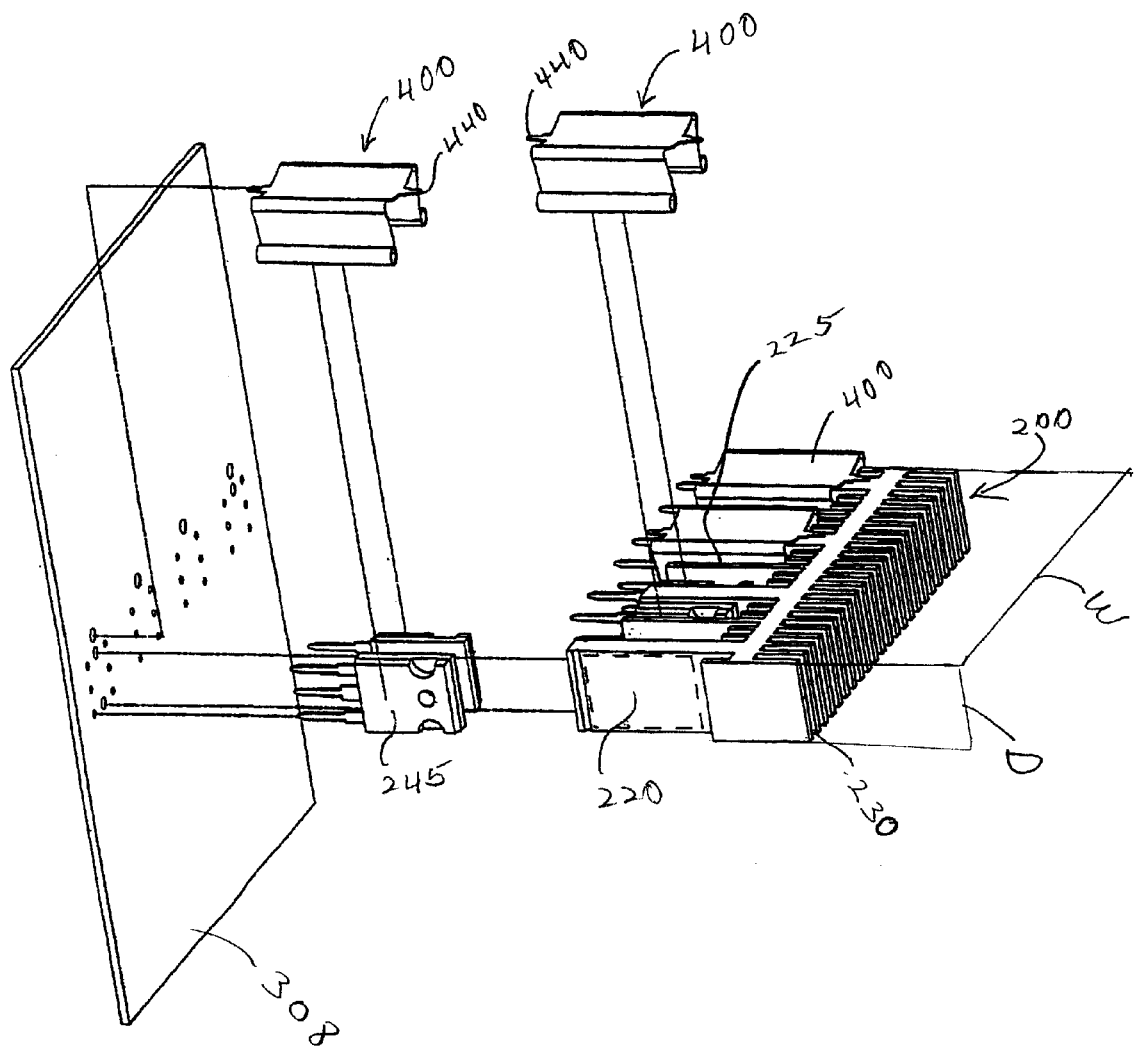

Located on the periphery of a arcuate portion 405 of the resilient strip 402 is a fastening pin 440 that can be used to secure and align the clip 400 to a circuit or wiring board on which the heat sink 200 is mounted. The fastening pin 440 is configured to be received by a corresponding hole or opening formed on the circuit board and may be nickel and tin plated to allow for ease of soldering to the circuit board. The pin 440 can also be used to provide a path to electrically connect the component mounted on the clip 400 to the rest of the circuit mounted on the board. While not shown, the clip 400 may have a fastening pin 440 on opposing ends of the arcuate portion 405 so that the possibility of incorrectly orienting the clip 400 is eliminated. FIG. 4B illustrates one way in which the clip 400 can be used to install an electrical component onto a device support leg 225 of the heat sink 200.

Figure 4C:
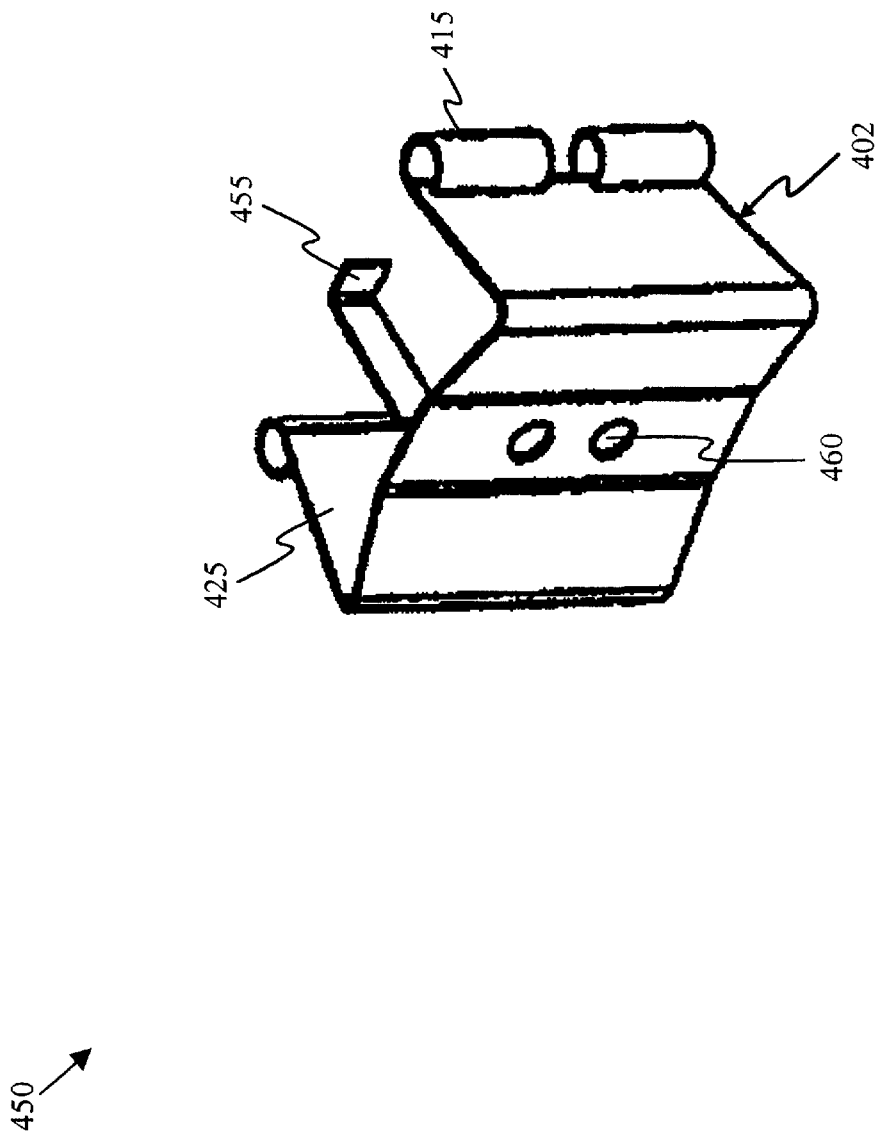

Turning to FIG. 4C, illustrated is an alternative embodiment clip 450 that is also preferably used for fastening electronic devices 245 to the electronic device support legs 220, 225. The alternative embodiment clip 450 is useful with the heat sink 200 described above, however, it is also equally useful with other similar heat sinks. The alternative embodiment clip 450 varies from the clip 400 illustrated in FIG. 4A. Rather than having the fastening pin 440 connected to the arcuate portion 405 to secure and align the clip 400 to the circuit or wiring board, the alternative embodiment clip 450 includes a retaining arm 455 extending from the resilient strip 402 and, that is configured to extend at least partially around the electronic device support or the electronic device, and thereby partially retain the electronic device against the electronic device support. The retaining arm 455 in one embodiment is a strip of metal that extends from the resilient strip 402 and has a bent end. The angle at which the end is bent may vary, for example the angle may range from about 45° to about 180°. However, the angle should be large enough to provide a restraining force against either the electronic device 245 or the electronic device support legs 220, 225. In a preferred embodiment of the alternative embodiment clip 450, which is illustrated in FIG. 4C, the retaining arm 455 is a footed retaining arm; that is, the end is bent at about a 90° angle. The alternative embodiment clip 450, may further include at least one hole 460 located therein. The hole 460, in a preferred embodiment, could be configured to receive an extensor portion from the electronic device support legs 220, 225, and prevent the alternative embodiment clip 450 from sliding along the electronic device support legs 220, 225.

Figure 4D:
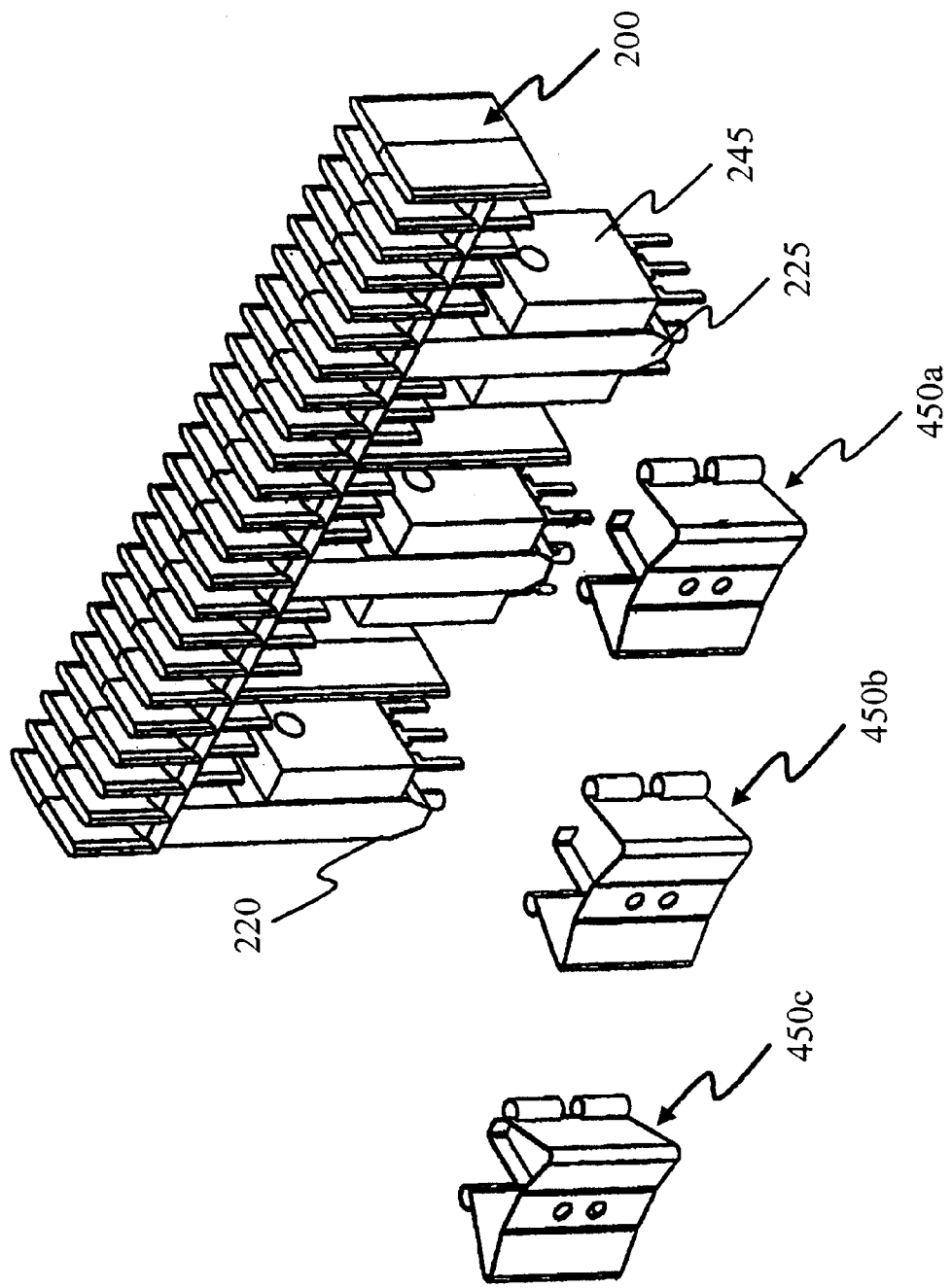
Figure 4E:
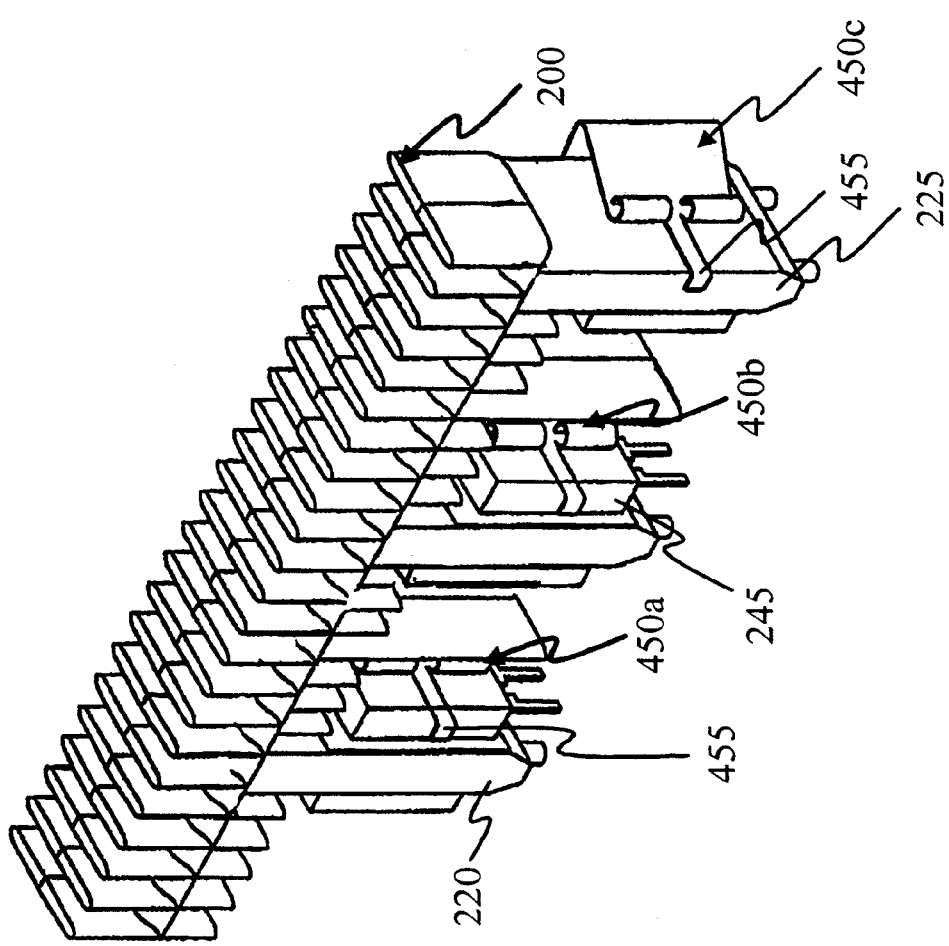

Turning to FIG. 4D, illustrated are alternative embodiment clips 450a, 450b, 450c positioned next to the heat sink 200. As illustrated, each alternative embodiment clip 450a, 450b, 450c, may be used to fasten one, or a plurality of electronic devices 245, to the electronic device support legs 220, 225. Turning to FIG. 4E, illustrated are the alternative embodiment clips 450a, 450b, 450c fastened to the electronic device support legs 220, 225. Alternative embodiment clip 450b illustrates that, in one embodiment, the retaining arm 455 may wrap around an opposing surface of the electronic device 245, and prevent the alternative embodiment clip 450b from accidentally retreating from the electrical device. Alternative embodiment clip 450c illustrates that, in an alternative embodiment, the retaining arm 455 may wrap around an opposing surface of the electronic device support leg 225, and prevent the alternative embodiment clip 450c from accidentally retreating from the electrical component or the electronic device support leg 225. Similar to the clip 400 disclosed above, the alternative embodiment clip 450 may be a metallic alloy, and more specifically, may have a sufficient spring-like elasticity so that the two opposing surface members 415, 425 are predisposed to return to their original shape when displaced.

Figure 5A:
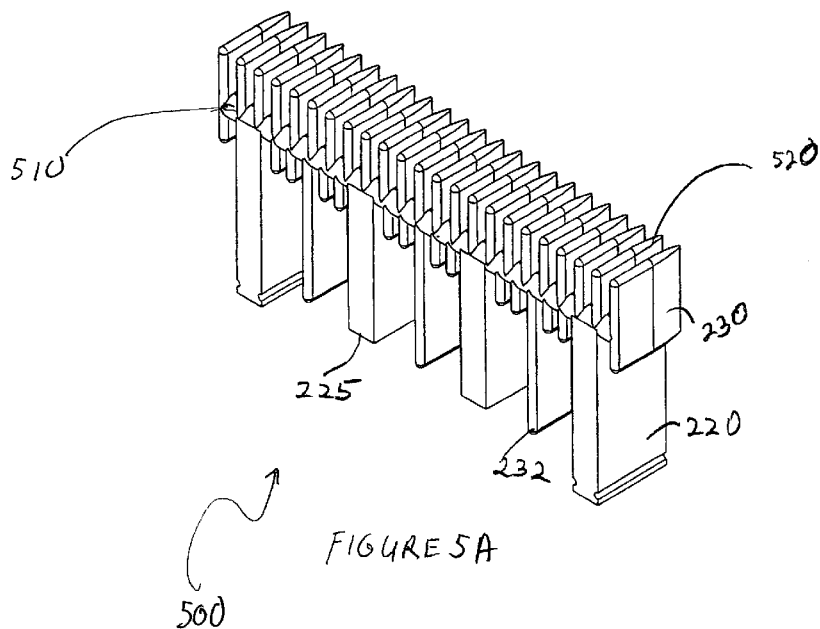
FIG. 5A illustrates a low drag embodiment of the invention.
Figure 5B:
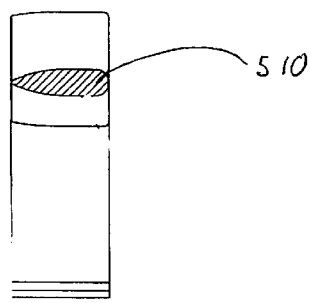
FIG. 5B illustrates a cross section view of the low drag embodiment of the invention showing the shape of the spine.
Figure 5C:
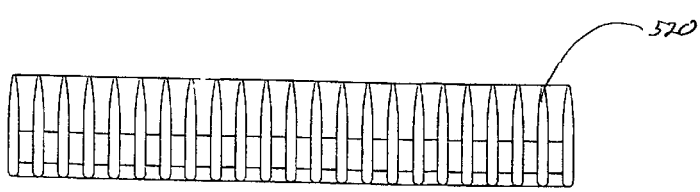
FIG. 5C illustrates the top view of the low drag embodiment of the invention showing the shape of the cooling fins.

Turning now to FIG. 5A illustrated is an embodiment of a heat sink 500 constructed in accordance with the present invention that has improved heat transfer characteristics. FIG. 5B illustrates a cross section view of this heat sink 500 embodiment showing a low drag shaped spine 510, such as that typically associated with an aircraft wing. FIG. 5C is a top view of the heat sink 500 embodiment showing the cooling fins 520 with a low drag shape such as that typically associated with an aircraft wing. This embodiment minimizes pressure drag such that substantially all of the pressure drop across the heat sink 500 is related to heat transfer.

In a similar fashion, the heat transfer characteristics of the clip 400, 450, can also be improved by providing the clip 400 with a low drag shape similar to that of the fins, as discussed above. In such embodiments, the air flows across the clip 400, 450 surface with minimal pressure drag.

An advantageous method of manufacturing will now be discussed. The heat sink 200 can be formed by any well known extrusion, casting, machining, or other manufacturing method. In a preferred embodiment, the heat sink 200 is extruded in such a way that the advantageous embodiments of the heat sink 200, as discussed above, will be incorporated. Once the heat sink 200 is formed, the required electrical components 240, 245 are attached to the electrical component support legs 220, 225 by using the above-discussed clip 400. The heat sink is then mounted on a printed wiring or circuit board on which various electrical components electrically have been attached. Ideally, the printed wiring or circuit board includes mounting holes configured to receive the heat sink's 200 mounting pins 221. The heat sink is then coupled to the printed wiring board by way of the mounting pins 221 engaging the board's mounting holes. The board typically has a cooling fan adjacent to the circuit or wiring board in order to provide cooling air transverse to the width of the heat sink 200. Of course, the board can include any embodiment or feature of the invention described herein and can be used in any electronic system, including a telecommunication, computer, or a power distribution system.

Although the present invention has been described in detail, those who are skilled in the art should understand that they can make various changes, substitutions and alterations herein without departing from the spirit and scope of the invention in its broadest form.

What is claimed is:
1. An electronics assembly, comprising:
   a printed wiring board having a heat sink coupled thereto, said heat sink having a plurality of cooling fins and an electronic device support;
   an electronic device couplable to said electronic device support; and
   a device retention clip securing said electronic device to said electronic device support, said device retention clip, including:
      a resilient strip having an arcuate portion and first and second opposing surfaces extending from said arcuate portion, said first and second opposing surfaces encompassing an electronic device and an electronic device support adjacent said electronic device; and
      a retaining arm extending from said resilient strip and extending at least partially around said electronic device support thereby to partially retain said electronic device against said electronic device support.
2. The electronics assembly as recited in claim 1 wherein said retaining arm is a footed retaining arm.
3. The electronics assembly as recited in claim 2 wherein said footed retaining arm wraps around an opposing surface of said electronic device to prevent said device retention clip from accidentally retreating from said electrical device.
4. The electronics assembly as recited in claim 2 wherein said footed retaining arm wraps around an opposing surface of said heat sink to prevent said device retention clip from accidentally retreating from said electrical device or said heat sink.
5. The electronics assembly as recited in claim 1 wherein said resilient strip has at least one hole located therein dimensioned to receive an extensor portion of said heat sink.
6. The electronics assembly as recited in claim 1 wherein said resilient strip is dimensioned to encompass a plurality of electronic devices.
7. The electronics assembly as recited in claim 1 wherein said resilient strip is a metallic alloy.
8. The electronics assembly as recited in claim 1 wherein said heat sink comprises:
   a spine having a width and first and second opposing sides, said first and second opposing sides oriented to be abnormal to a substrate when said heat sink is mounted on said substrate;
   at least two electronic device supports extending generally transverse from said first side, each of said electronic device supports dimensioned to support a heat generating electrical component thereon; and
   a plurality of cooling fins extending from said spine, each of said plurality of cooling fins having a depth that is substantially less than said width of said spine.
9. The electronics assembly as recited in claim 1 wherein said electronic device support is an electronic device support leg.

* * * * *